US00RE35405E

United States Patent [19]

Murakami et al.

[11] E Patent Number: Re. 35,405

[45] Reissued Date of Patent: Dec. 17, 1996

[54] METHOD OF MANUFACTURING SEMICONDUCTOR DEVICE UTILIZING AN ACCUMULATION LAYER

[75] Inventors: Yoshinori Murakami, Yokohama; Teruyoshi Mihara, Yokosuka, both of Japan

[73] Assignee: Nissan Motor Co., Ltd., Yokohama, Japan

[21] Appl. No.: 288,731

[22] Filed: Aug. 12, 1994

Related U.S. Patent Documents

Reissue of:

[64] Patent No.: 5,132,238
Issued: Jul. 21, 1992
Appl. No.: 631,928
Filed: Dec. 20, 1990

[30] Foreign Application Priority Data

Dec. 28, 1989 [JP] Japan ..... 1-341130
Apr. 6, 1990 [JP] Japan ..... 2-90096

[51] Int. Cl.[6] ..... H01L 21/338

[52] U.S. Cl. ..... 437/41 GS; 437/44.911; 437/984; 148/DIG. 50

[58] Field of Search ..... 437/6, 40, 41, 437/44, 67, 225, 911, 984; 148/DIG. 50, DIG. 126

[56] References Cited

U.S. PATENT DOCUMENTS 4,378,630 4/1983 Horng et al. ..... 437/233
4,826,781 5/1989 Asahina et al. ..... 437/41
4,994,406 2/1991 Vasquez et al. ..... 437/67

FOREIGN PATENT DOCUMENTS 55-85069 6/1980 Japan .
55-108768 8/1980 Japan .

*Primary Examiner*—Chandra Chaudhari
*Attorney, Agent, or Firm*—Foley & Lardner

[57] ABSTRACT

A method of manufacturing semiconductor devices by forming a U-shaped insulated gate on a substrate, etching the substrate to expose a sidewall of the U-shaped insulated gate, covering the exposed part with a masking material, forming the sidewall of the masking material only adjoining to the exposed U-shaped insulated gate, etching the substrate vertically to form a groove, forming a semiconductor region on the groove and burying a metal into the groove.

7 Claims, 12 Drawing Sheets

METHOD OF MANUFACTURING SEMICONDUCTOR DEVICE UTILIZING AN ACCUMULATION LAYER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method of manufacturing semiconductor devices such as insulated gate electrostatic induction type transistors, vertical MOS semiconductor devices utilizing an accumulation layer, etc.

2. Description of the Prior Art

It is possible to consider a construction such that insulated gate electrostatic induction type transistors can be obtained by replacing conventional junction gates with insulated gates, as shown in FIG. 1(A), which comprises an $n^-$ drain region 1, $n^+$ source regions 2, gate electrodes 3, gate insulating films 4, and interlayer insulating films 5, The drain region 1 is ohmically connected to a drain electrode 11. The drain region 1 and the source regions 2 are insulated from the gate electrodes 3 by the gate insulating films 4, respectively. A source electrode 22 is ohmically contacted to source regions 2, and also formed on the interlayer insulating films 5. Here, the drain between the two adjacent insulated gates 4 is called "channel" in the device structure, and a distance between the two insulated gates 4 designated by H is called "channel range thickness". In the above structure, current is cut off by a depletion layer developed in the vicinity of the insulated gate 4. However, in the case of the insulated gate, being different from the junction gate, there exists a limit in the width of the depletion layer developed by forming the accumulation layer of minor carrier in the vicinity of the insulated gate 4, Therefore, there exists a limitation with respect to the relationship between the impurity atom concentration $N_D$ within the channel range and the thickness H of the channel range as expressed by the following formula:

$$H < 2\left(\frac{4\phi_f \cdot \epsilon}{q \cdot N_D}\right)^{1/2}$$

where q denotes the electron charge; $\epsilon$ denotes the dielectric constant of the semiconductor of the drain region; $\Phi f$ denotes the absolute Fermi potential value of the semiconductor expressed as $$\phi_f = \frac{kT}{q} \ln\left(\frac{N_D}{Ni}\right)$$

where k denotes the Boltzmann constant; T denotes the absolute temperature and Ni denotes the intrinsic carrier concentration of the drain region semiconductor.

The above formula indicates that the channel range thickness H is less than twice the developable depletion width of one of the insulated gate. When H exceeds the right side in the above formula; it is impossible to cut off the current, even if a high voltage is applied to the gate.

By way of example, in the case of silicon semiconductor, the required channel range thickness is 4.8 μm or less when the impurity atom concentration of the drain region is $1\times10^{-}$ $cm^{-3}$, and 1.7 μm more less when the impurity atom concentration is $1\times10^{15}$ $cm^{-3}$. Therefore, when a high impurity atom concentration is required to some extent as in the case of low voltage resistant devices, it is practically impossible to form such a microstructure as described above.

On the other hand, a prior art MOS semiconductor device utilizing an accumulation layer is disclosed in Japanese published Unexamined (Koka) Patent Appli. No. 55-108768 entitled "Electrostatic Induction Thyristor", as shown in FIG. 1(B). In the drawing, the semiconductor devices comprises an $n^-$ drain region 1, a $p^+$ region 20, $n^+$ source region 2. The drain electrode 11 is ohmically connected to the $p^+$ region 20. A gate electrode 3 is insulated from the drain region 1 and the source region 2 by a gate insulating film 4. The thickness of the film 4 opposing the drain electrodes 11 is large to increase the voltage resistant characteristics. A source electrode 22 is ohmically connected to the source region 2. Further, in FIG. 1(B) although two and half unit structures in each of which is composed of an insulated gate 4 and a source region 2 are shown, in practice a plurality of unit structures are arranged in parallel within an single chip.

The portion sandwiched between the two insulated gates 4 within the drain region 1 is called "channel" of the device structure the distance between two insulated gates 4 represented by H is called "thickness of channel range"; and the symbol L is called "channel length". Further, since the above document is a thyristor patent, the $p^+$ region 20 is included in the structure shown in FIG 1(B) so as to provide a bipolar element.

On the other hand, in a semiconductor device realized by the manufacturing method of the present invention as described later, no $p^+$ region 20 is disclosed because of a unipolar element. However, the structure of the source regions and the gate electrodes is the same, and therefore the presence or absence of the $p^+$ region 20 will not exert any influence upon the function and the structure thereof.

The operation of the above-mentioned MOS semiconductor element utilizing the above accumulation layer will be described hereinbelow.

The source electrode 22 is grounded, and a positive voltage is applied to the drain electrode 11. Under these conditions, when the gate electrode 3 is grounded or a negative potential is applied to the gate electrode 3 to develop a depletion layer in the channel range, conductive electrons can not flow out of the sources region 2, so that current is cut off. Further, when a negative potential is removed from the gate electrode to remove the depletion layer in the channel range or when a positive potential is applied to the gate electrode to form electron accumulative layer in the vicinity of the insulated gate, the source region is conductive to the drain region to allow a main current to flow. Once the accumulation layer is formed in the vicinity of the insulated gate, since the conductivity of the accumulation layer is high, the resistance of the channel range is reduced and therefore disregarded, as compared with the drift resistance of the drain region.

Further, in the above structure, if conductive electrons are emitted from the source region 2, since positive holes of the minor carrier are injected from the $p^+$ region 20 on the drain side, the resistance of the $n^-$ drain region 1 is further reduced on the basis conductivity modulation effect.

In the above-mentioned structure, however, the channel structure is restricted as follows: Although the main current is cut off by the depletion layer developed in the vicinity of the insulated gate as already described, in the case of insulated gate, being different from the junction gate, since an inversion layer of the minor carrier is formed in the vicinity of the gate insulating film there exists a limit in the width of the developable depletion layer. That is the impurity atom concentration $N^D$ of the channel range and the thickness H of the channel range are also restricted in accordance with the afore-mentioned formula.

To overcome the above-mentioned "Limitation of Channel Range Thickness", Japanese Published Examined (Kokoku) Patent Appli. No. 62-44698 or (Kokai) Patent Appli. No. 55-85069 has disclosed "Insulated Gate Transistor", in which additional fixed-potential control gates are provided in the vicinity of driving U-shaped insulated gates, respectively to control the various device characteristics on the basis of the potential of the control gates. The fixed potential control gates are of pn-junction gates, Schottky gates or insulated gates of other types.

FIG. 2(A) shows a prior-art device structure where the control gates 6 fixed to the source electrode 22 are formed in the form of junction gates. This device comprises an $n^-$ drain region 1 $n^+$ source regions 2, gate electrodes 3, gate insulating films 4, interlayer insulating films 5, and p-type control gates 6, A drain electrode 11 is ohmically connected to the drain region 1, The drain region 1 and the source regions 2 are insulated by the gate insulating films 4. The source electrode 22 is electrically connected to the p-type control gates 6 and the source regions 2. In this device structure, when the impurity atom concentration of the p-type control gate 6 is high, since the built-in depletion layer is developed mainly in the $n^-$ drain region 1, it is possible to electrically cut off the channel range (the drain region sandwiched between two different types of gates) in dependence upon the depletion layer developed in the gate electrode, beyond the limitation defined by the aforementioned formula. The current conduction between the drain region and the source region can be attained on the basis of the accumulation layer formed in the virginity of the insulated gate in the same way as in the prior-art devices. Further, FIG. 2(B) shows another method in which each control gate in connected to a control gate terminal 66 to apply a negative fixed potential thereto.

The above-mentioned control gates 6 as shown in FIGS. 2(A) and 2(B) can be generally formed by selectively injecting and diffusing p-type impurity ions into between the insulated gates 4 by photoprocess as shown in FIG. 2(C). In FIG. 2(C), the reference numeral 100 denotes a resist and 600 denotes a range where p-type impurity atoms are ion-injected. Further, FIG. 2(D) shows another method in which a groove is formed in a specific range between the two insulated gates 4 by photoprocess to diffuse p-type impurity atoms into the groove inside. Further, it is also possible to bury a metal in the groove so as to be Schottky junctioned to the $n^-$ substrate 1.

In the above-mentioned prior-art methods, there exist two serious problems as follows: The first problem relates to the dispersion of the device threshold value (turn-on voltage). That is, when a photomask for forming the control gates is mismatched, the threshold value of channel range becomes different between both the sides of the control gate 6, and therefore the device characteristics are not uniform.

The second problem relates to pattern microstructure or fine structure to increase the device current capacity. With the first problem in mind, it is necessary to set the channel range size to such a large degree as 5 to 10 times the mask matching precision of the photodevice. This is indispensable when the control gates are formed by photoprocess. For example, where such a photodevice that the minimum formable pattern size is 3 μm and the matching precision is 0.5 μm is used, the minimum unit in the device structure is about 6 to 8 μm, which is the pattern size limitation.

As described above, in the first prior-art structure as shown in FIGS. 1(A) and 1(B), there exists a limitation in channel thickness within which the channel range can be cut off, so that it has been difficult to apply the first prior-art structure to low-voltage resistant device having a high impurity atom concentration in the channel range.

Further, in the second prior-art structure as shown in FIGS. 2(A), 2(B) and 2(D), although it is possible to avert the problem related to the first prior-art structure, there still exists a limitation in photoprocess precision when the pattern microstructure is required to allow the threshold value to be uniform or to increase the entire current capacity.

SUMMARY OF THE INVENTION

With these problems in mind therefore, it is the primary object of the present invention to provide a method of manufacturing semiconductor devices which can reduce the channel range thickness between the two adjacent insulated gates at higher manufacturing precision to realize a device microstructure, so that low-breakdown-voltage devices can be manufactured without limitation between the channel range thickness and the channel range impurity atom concentration, and additionally the entire device current capacity can be increased without dispersion in device characteristics.

To achieve the above-mentioned object, when applied to an insulated gate electrostatic induction type transistor, the method of manufacturing a semiconductor device according to the present invention comprises the steps of: (a) forming at least one U-shaped insulated gate (4) on the surface of a first conductivity type semiconductor substrate (1); (b) exposing part of sidewalls of said U-shaped insulated gate (4) by etching said substrate; (c) covering the exposed part with a masking material; (d) forming the sidewall (200) of said masking material only adjoining to the side of said exposed U-shaped insulated gate (4); and (e) forming at least one groove by etching said substrate almost vertically using said masking material sidewall (200) as a mask.

In this transistor, the metal buried in the vertical groove is Schottky junctioned to the first conductivity semiconductor substrate. Further, it is also preferable to form a second conductivity type semiconductor region (6) or a second insulated gate (404) as a control gate on the surface of the formed vertical groove. The masking material is an insulating film or a polycrystalline semiconductor film or amorphous film containing first conductivity impurity atoms at high concentration. Further, the source region is formed under the sidewall masking material by annealing the device to diffuse impurity atoms contained in the masking material into the semiconductor substrate.

In the method according to the present invention, after the driving insulated gates have been formed, the semiconductor substrate surface is etched to partially expose the side surface of the insulated gate, and so-called masking material sidewalls are formed on the side of the exposed U-shaped insulated gate by an insulating film or a polycrystalline or amorphous semiconductor film; and various control gates are formed by etching the semiconductor substrate in the vertical direction by using the masking material sidewalls as masks. Therefore, it is possible to form a uniform device microstructure having almost no dispersion in an extremely short distance between the insulated gate and the control gate. The channel thickness is controlled according to the thickness of each film of the masking material sidewall. The practical formed film thickness lies within a range from 50

Å to 1 μm, and therefore the formed channel width lies within the same range. The present method can be applied to the case where the upper limit of the above channel width H is large, because even if the impurity atom concentration is low in the drain region, the narrow channel width is also preferable.

When the present invention is applied to a vertical MOS semiconductor device, the method of manufacturing a semiconductor device according to the present invention comprises the steps of: (a) forming a first conductivity type and high impurity concentration source region (2) on the surface of a first conductivity type semiconductor substrate (1); (b) forming masking films (100, 101, 102) on said source region; (c) removing part of said films for gate electrode (3); (d) shallowly removing a part of source region (2) by [anisotropic] *isotropic* etching to form side-etched portion under said masking films; (e) deeply removing said substrate (1) by [isotropic] *anisotropic* etching using said masking films as a mask to form groove for gate electrode; (f) forming gate oxide film (4) on the surface of said gate groove; (g) burying a conductive material (3) into said groove as gate electrode; (h) forming interlayer insulating film (5) on the surface of said gate material to accomplish T-shaped insulated gate; (i) removing the remaining masking films on the surface of said source region (2); (j) deeply removing said substrate by [isotropic] *anisotropic* etching by using said T-shaped insulated gate (3) as mask to form almost a vertical groove; and (k) burying metal into said groove as source electrode (22).

In the method according to the present invention, the channel thickness H can be controlled down to 0.02 to 2 μm with small dispersion, according to the degree of isotropic side-etching of the substrate. Therefore, it is possible to form the channel in a high impurity atom concentration substrate, thus realizing microstructure unit. Further, if the substrate impurity atom concentration is low, since the thin channel will not be disadvantageous, it is possible to increase the channel density per unit area based upon a micropattern and therefore to increase the current capacity.

BRIEF DESCRIPTION OF THE DRAWINGS

FIG. 8(A) shows the OFF state and FIG. 8(B) shows the ON state of the device.

DETAILED DESCRIPTION OF THE PREFERRED EMBODIMENTS

Figure 1:
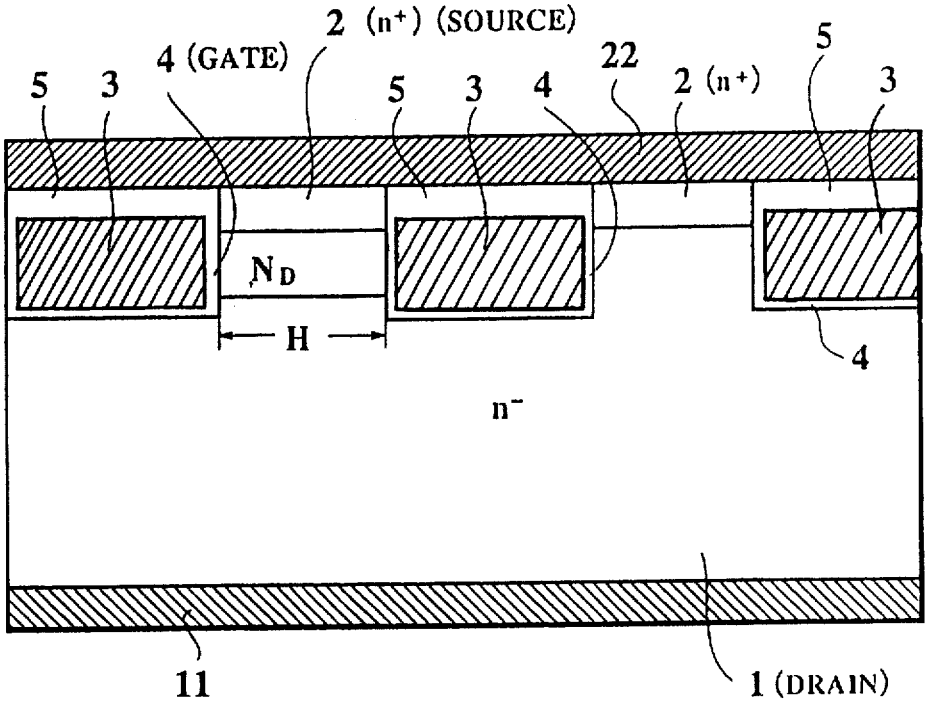
FIG.1 (A) PRIOR ART
FIG. 1(A) is a cross-sectional view showing a first prior-art semiconductor device.
FIG. 1(B) is a cross-sectional view showing a second prior-art semiconductor device.
Figure 1:
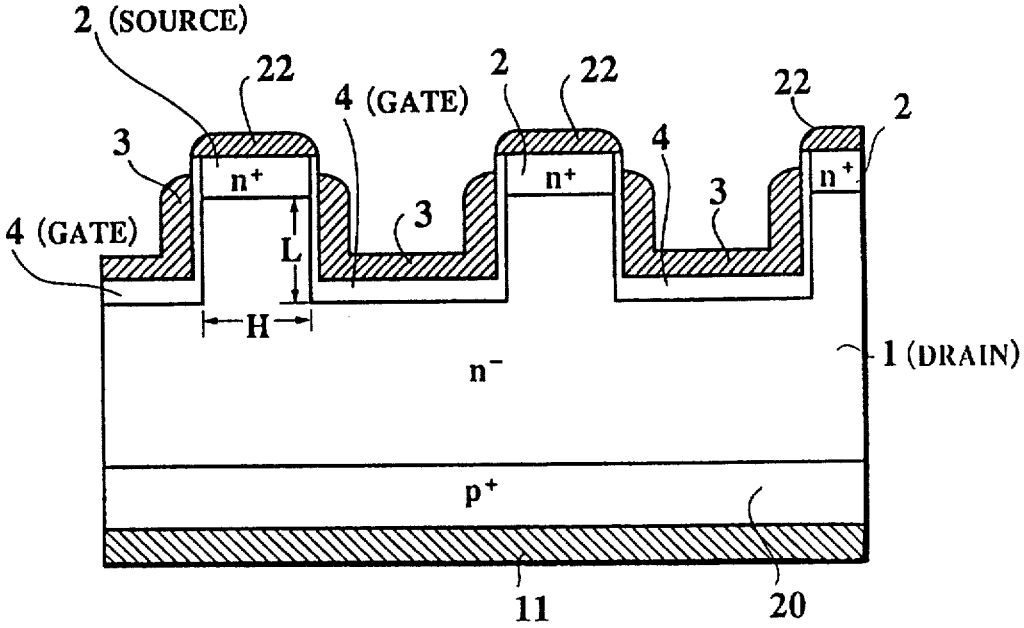
FIG.1 (B) PRIOR ART
Figure 2:
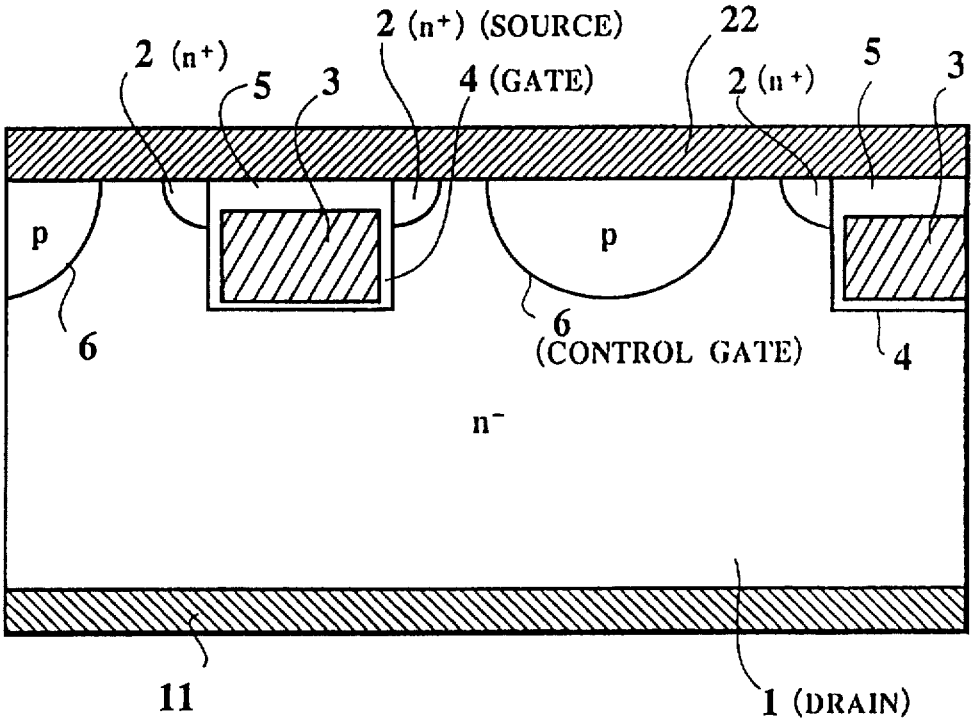
FIG.2 (A) PRIOR ART
FIG. 2(A) is a cross-sectional view showing a third prior-art semiconductor device.
FIG. 2(B) is a cross-sectional view showing a first modification of the third prior-art semiconductor device.
FIG. 2(C) is a cross-sectional view for assistance in explaining the method of forming control gates in the third prior-art semiconductor device.
FIG. 2(D) is a cross-sectional view showing a second modification of the third prior-art semiconductor device.
Figure 2:
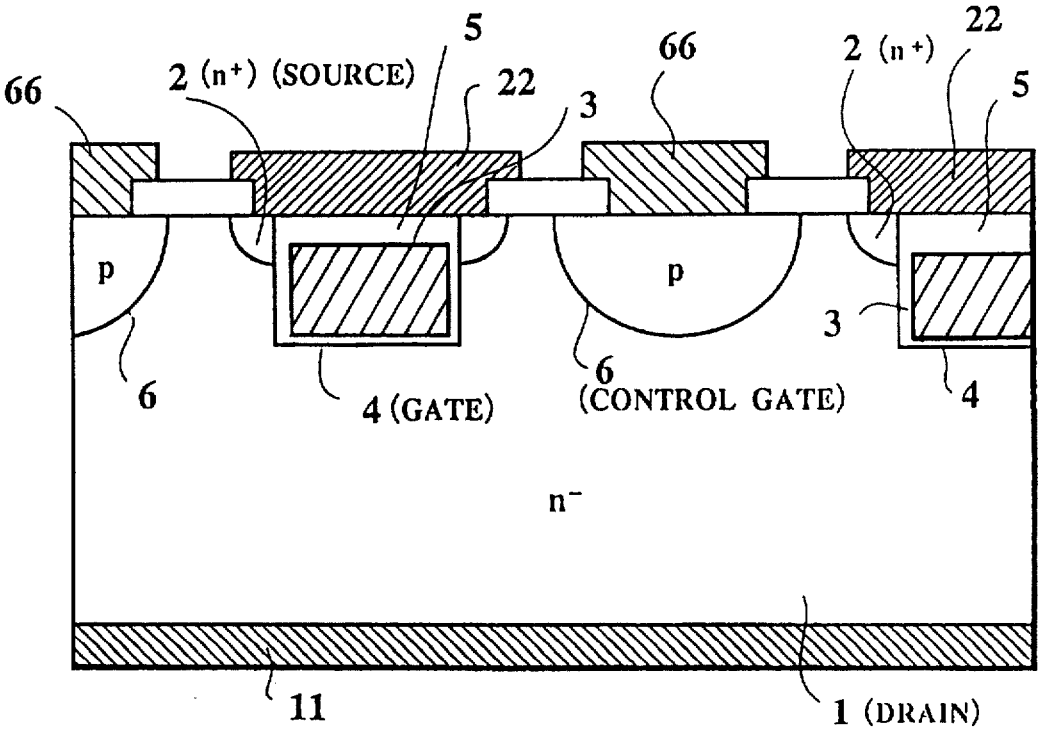
FIG.2 (B) PRIOR ART
Figure 2:
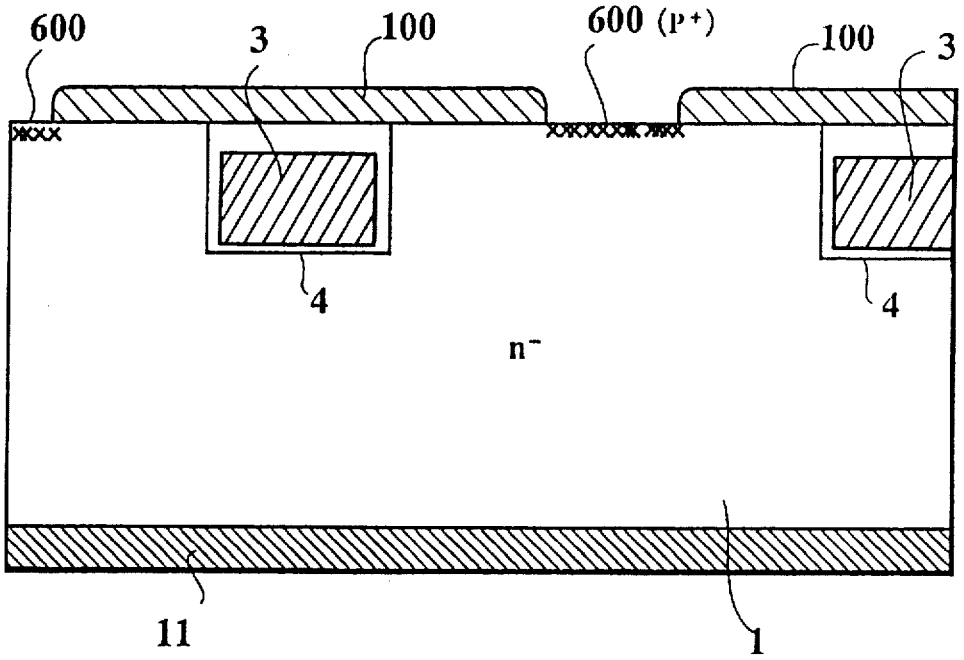
FIG.2 (C) PRIOR ART
Figure 2:
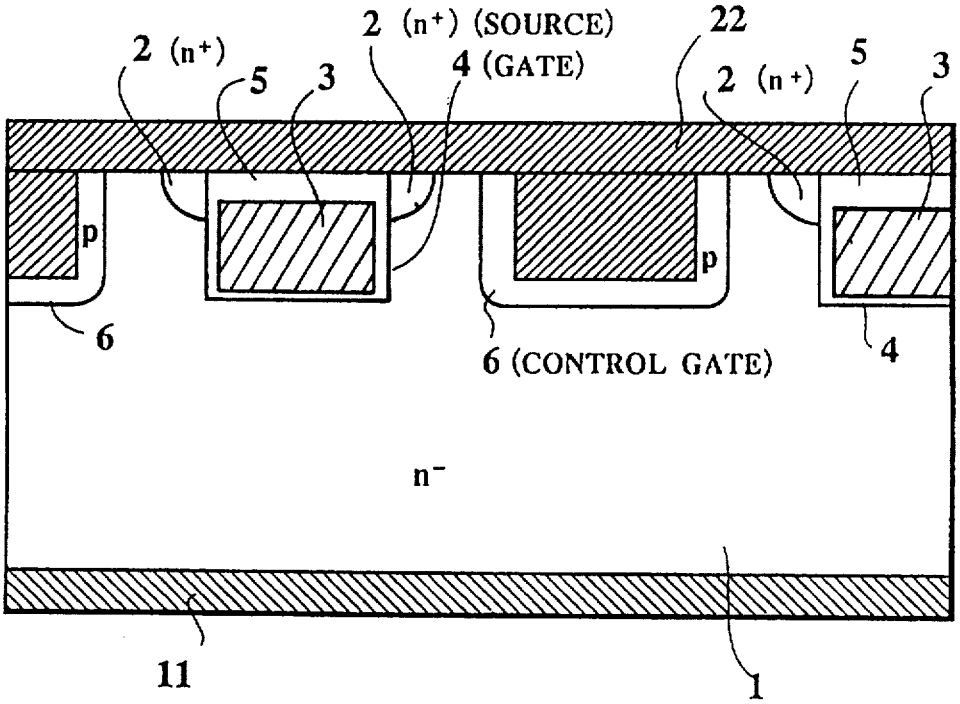
FIG.2 (D) PRIOR ART

The method of the present invention will be described hereinbelow with reference to the attached drawings. The feature of the method according to the present invention is to form control gate grooves or control gate electrode grooves by using masking material sidewalls (200) as masks, in self-alignment manner to realize a device microstructure.

FIGS. 3(A) to 3(E) show cross-sectional views showing the process of manufacturing an insulated gate electrostatic induction type transistor in accordance with the method according to the present invention.

In FIGS. 3(A) to 3(E), the device comprises an $n^-$ drain semiconductor substrate 1, insulated gates 4, gate electrodes 3, $n^+$ source regions 2, interlayer films 5, a drain electrode 11, a source electrode 22 connected to both the source regions 2 and control gates 6.

Figure 3:
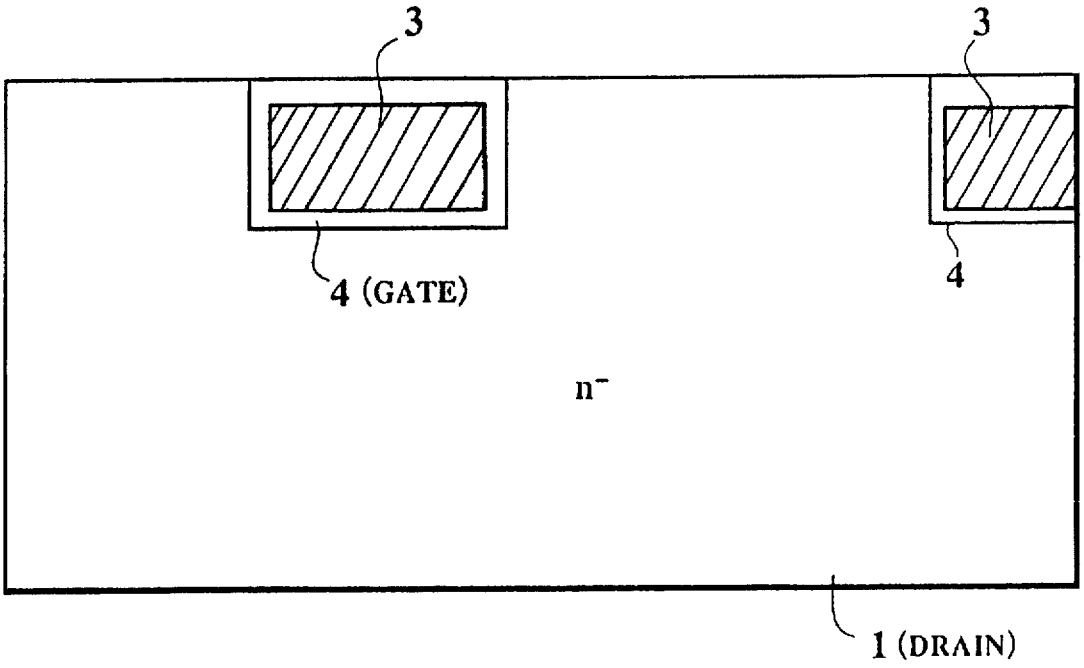
FIGS. 3(A) to 3(E) are cross-sectional views showing the manufacturing process of an insulated gate electrostatic induction type transistor, for assistance in explaining a first aspect of the method of manufacturing semiconductor devices according to the present invention.
Figure 3:
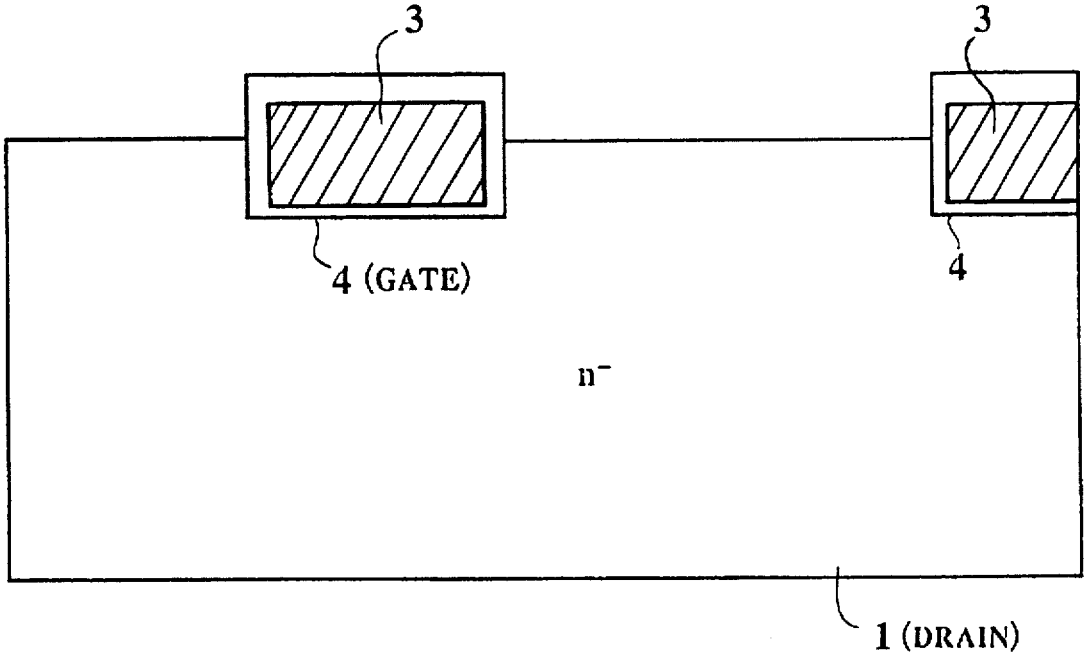
Figure 3:
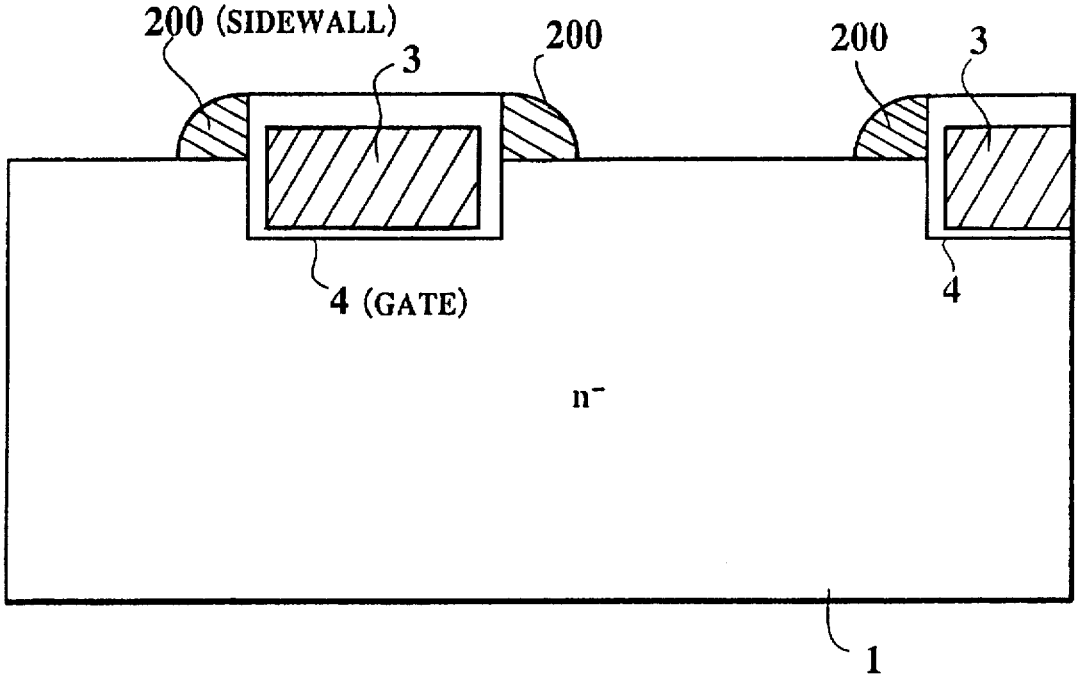
Figure 3:
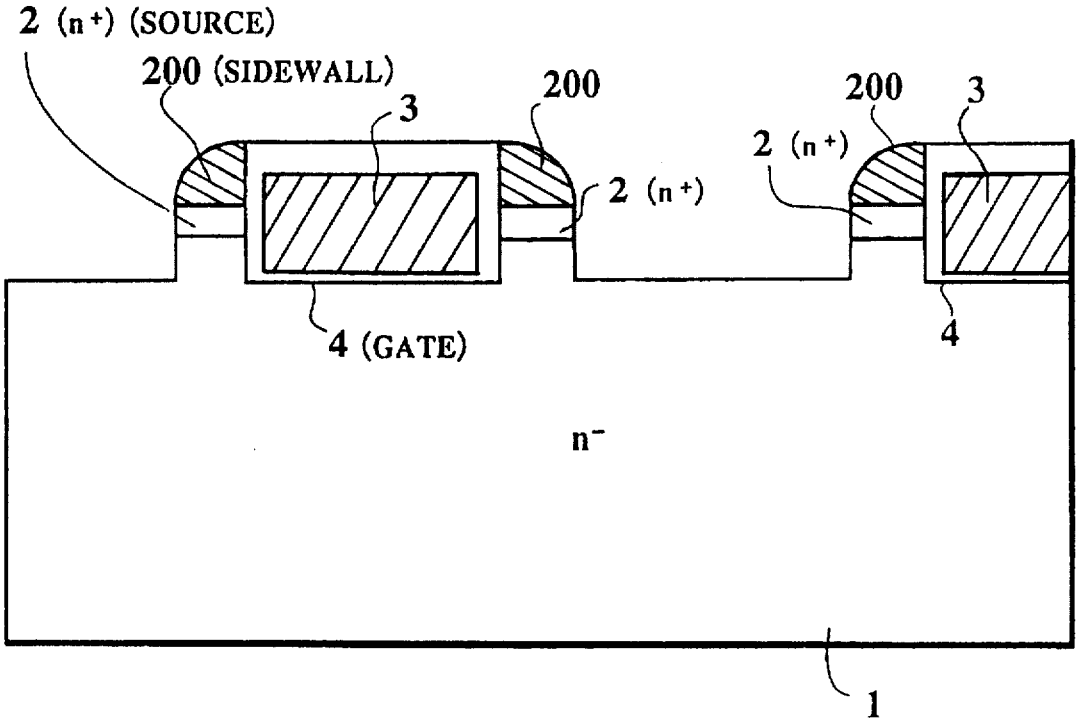
Figure 3:
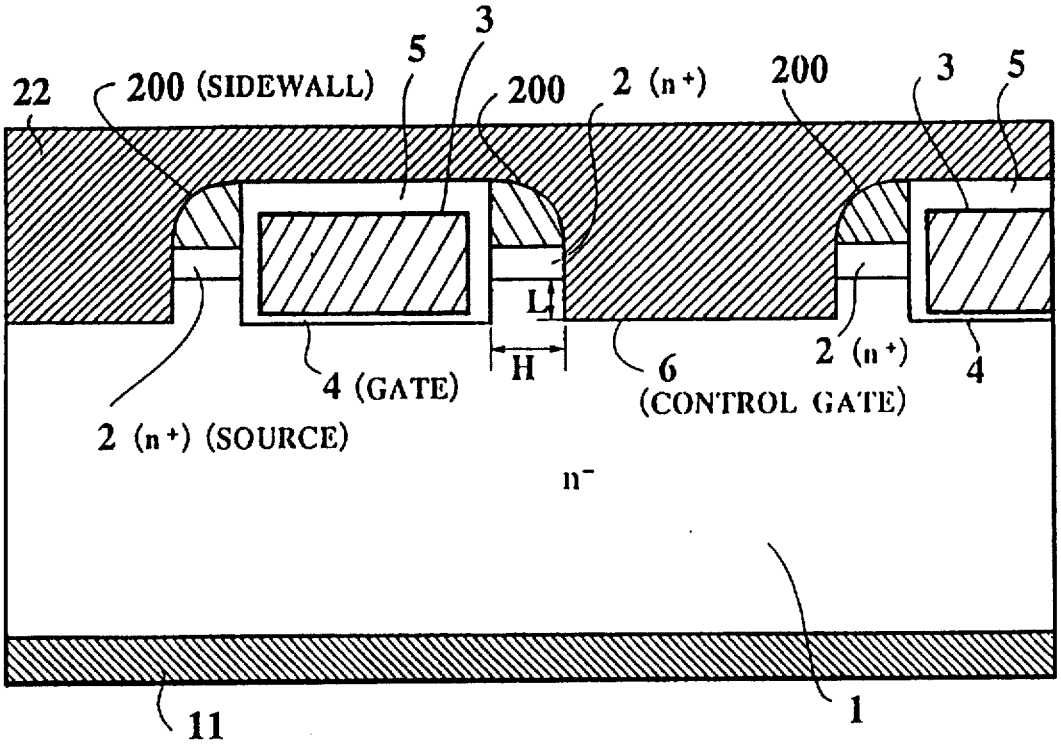

As shown in FIG. 3(A), first, U-shaped insulated gates 4 and gate electrodes 3 are formed on the surface of an $n^-$ drain semiconductor substrate 1. Secondly, as shown in FIG. 3(B), the semiconductor surface is etched by a thickness of 5000 to 6000 Å to expose part of each of sidewalls of each U-shaped insulated gate 4. Thereafter, a masking material such as an insulating film (insulator), a polycrystalline semiconductor (e.g. PSG) film or an amorphous semiconductor film with a thickness of about 5000 Å is formed on the exposed surfaces thereof into a blanket shape. The masking material is semiconductor containing n-conductivity type impurity atoms at high concentration. Further, it is also preferable to ion implant n-type impurity atoms into the surface of the substrate 1 before forming the masking material (film). This film is etched by a reactive ion etching method to leave the film only on each side surface of each of the exposed U-shaped insulated gates 4, as shown in FIG. 3(C), as sidewalls 200.

At this stage, the device is heat treated (annealed) to form $n^+$ source regions 2 by diffusing the high concentration impurity atoms of the masking material film into the $n^-$ semiconductor substrate 1. Of course, it is possible to form the $n^+$ source regions 2 by another process by replacing the film with another masking material and forming the source regions 2 by another process.

The substrate 1 is further etched vertically from the surface thereof by using the sidewalls 200 as masks as shown in FIG. 3(D). The most simple method of forming the control gate 6 is to bury a metal Schottky-junctioned to the drain region 1 within each groove, as shown in FIG. 3(E). In this case, the channel width is 5000 Å and it is possible to increase the impurity atom concentration $N_D$ of the channel range up to about $1\times10^{16}$ $cm^{-3}$.

When the minimum pattern is realized in this structure by use of the same photodevice having a 3 μm minimum pattern formable size and a 0.5 μm matching precision, since the control gate can be formed by a self-alignment method, independently from the locations of the insulated gates 4, it is possible to form the insulated gates 4 by the minimum pattern, so that the minimum unit of the device structure can be reduced down to 3 μm.

Figure 4:
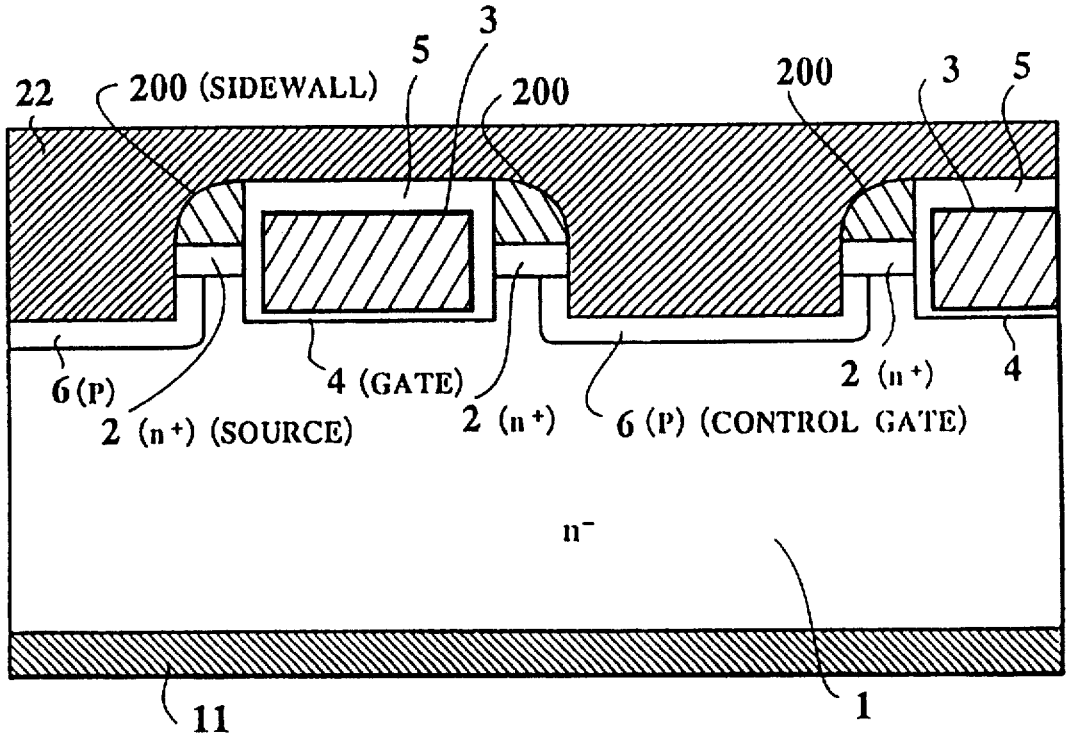
FIG. 4 is a cross-sectional view showing a first modification of the insulated gate electrostatic induction type transistor shown in FIGS. 3(A) to 3(E)

FIG. 4 shows another modification of the insulated gate electrostatic induction type transistor manufactured in the same way. In this device, before the metal is buried in the grooves formed in the substrate 1, p-type semiconductor regions 6(p) are formed as control gates 6 on the surface of the grooves by vapor growth diffusion method, and then the control gate electrodes (i.e. the source electrodes) 22 are buried therein.

Figure 5:
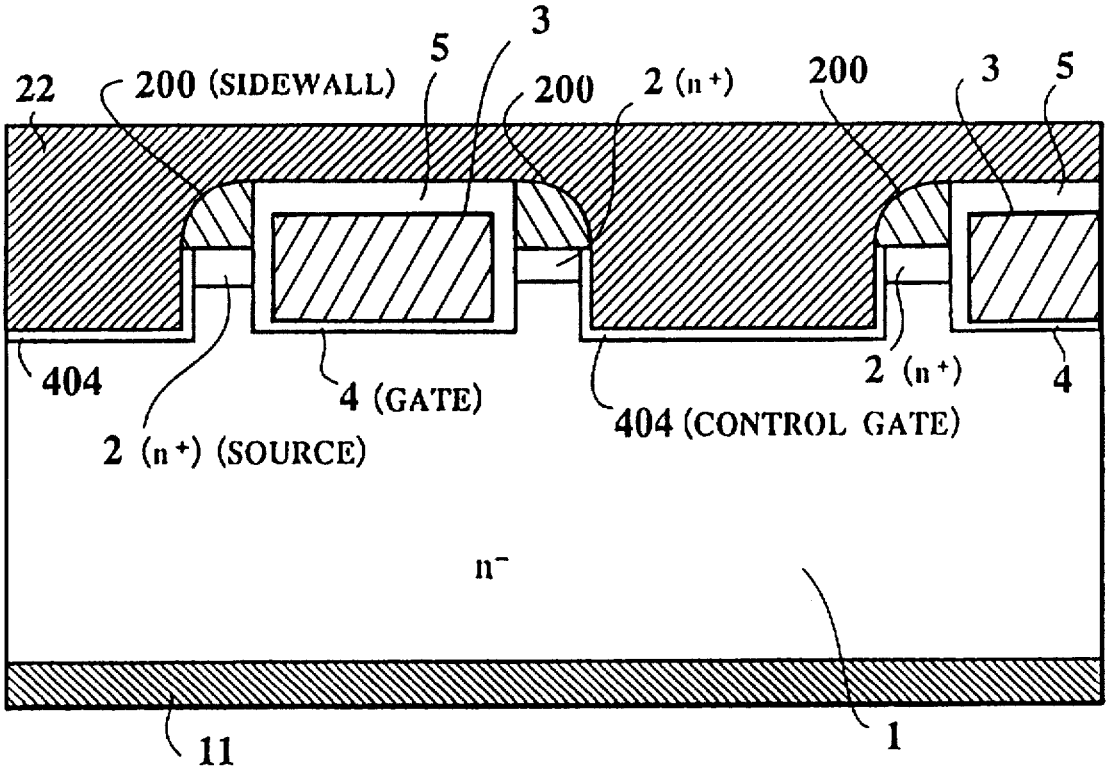
FIG. 5 is a cross-sectional view showing a second modification of the insulated gate electrostatic induction type transistor show in in FIGS. 3(A) to 3(E)

FIG. 5 shows further another modification of the insulated gate electrode induction type transistor manufactured in the same method. In this device, each second insulated gate 404 is formed in each groove. In this device, the source conduction can be readily realized by using $n^+$ polycrystalline silicon as the masking material 200.

As described above, in the method according to the present invention, since the semiconductor substrate (1) surface is etched to partially expose the side surfaces of the gates 4 after the driving insulated gates 4 have been formed; so-called masking material sidewalls 200 are formed on the exposed side surface of the gates 4 by an insulating film or a polycrystalline or amorphous semiconductor film; and various control gates 6 and 404 are formed by etching the semiconductor substrate in the vertical direction by using the sidewall 200 as mask, it is possible to form a uniform device structure having almost no dispersion in an extremely short distance between the insulated gate 4 and the control gate 6, thus realizing an appropriate microstructure of the semiconductor device.

FIGS. 6(A) to 6(H) show cross-sectional views showing the process of manufacturing a vertical MOS semiconductor device utilizing accumulation layers in accordance with the method according to the present invention.

Prior-to description of the manufacturing method of the present invention, the structure and the operation principle of a semiconductor device utilizing accumulation layers will be explained hereinbelow.

Figure 7:
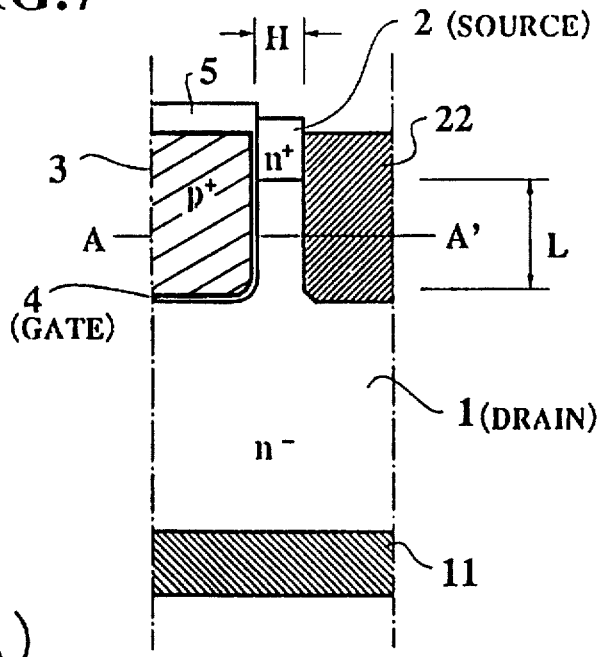
FIG. 7 is a partial cross-sectional view showing only the essential portion of the vertical MOS semiconductor device shown in FIG. 6(H)

FIG. 7 is a cross-sectional view showing the essential portion of a device having an $n^-$ silicon substrate.

In FIG. 7, the device comprises an $n^-$ drain region 1, a drain electrode 11, an $n^+$ source region 2, a metal 22 Schottky junctioned to the drain region 1 as a source electrode also connected to the source region 2, a gate electrode 3 formed of a metal or polysilicon doped into a $p^+$-type semiconductor, a gate oxide film 4, and an interlayer insulation film 5.

Further, the range sandwiched between the insulated gate 4 in the drain region 1 and the Schottky junction portion is called "channel" of this semiconductor device. Further, the distance H (referred to as "channel thickness") between the insulated gate electrode 3 and the Schottky junction portion is shorter than the depletion layer thickness when the Schottky junction is zero-biased.

Further, when the channel depth L is equal to or less than the channel thickness H, the device characteristics are of triode characteristics; and when L is about three time larger than H, the device characteristics are of pentode characteristics.

This device is used by grounding the source electrode 22 and by applying a positive voltage to the drain electrode 11. When the gate electrode 3 is grounded, since the channel range is changed into depletion state due to a difference in work function between the material of the gate electrode 3 and the channel range and the effect of Schottky junction of the source electrode 22, so that current will not flow between the drain and source regions. Further, when a positive potential is applied to the gate electrode 3, since an accumulation layer is formed in the vicinity of the gate insulating film 4, so that current flows between the source and drain regions.

Figure 8:
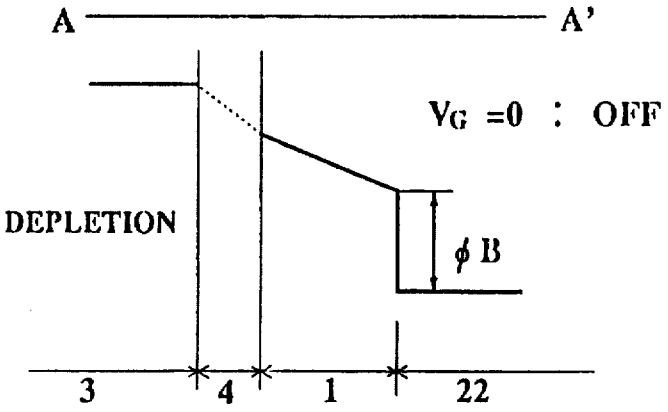
FIGS. 8(A) and 8(B) are energy band diagrams of the "channel" region of the vertical MOS semiconductor device taking along the line A–A' in FIG. 7, which show only conduction band line for simple explanation.
Figure 8:
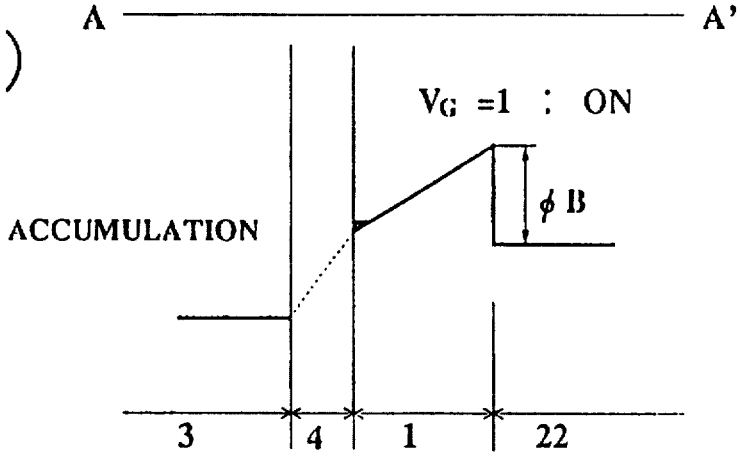

FIGS. 8(A) and 8(B) show band structures taken along the line A—A' in FIG. 7, in which only the lower end line of the conductive band is shown. In the drawings, $\Phi_B$ denotes a barrier height of the Schottky junction between the drain region 1 and the source electrode 22 shown in FIG. 7. Further, FIG. 8(A) shows the case obtained when the gate voltage is at 0 volt, and FIG. 8(B) shows the case obtained when a positive potential is applied to the gate so that an accumulation layer is formed in the vicinity of the insulated gate.

When the gate voltage is at 0 volt, as shown in FIG. 8(A), since the channel range changes into a depletion state due to the Schottky barrier and a difference in semiconductor work function between the gate electrode material and the channel range, no electrons flow therethrough. Further, when a positive potential is applied to the gate, since an accumulation layer is formed in the vicinity of the gate insulating film, current flows between the source region 2 and the drain region 1.

The method of manufacturing the semiconductor device shown in FIG. 7 will explained with reference to FIGS. 6(A) to 6(H).

Figure 6:
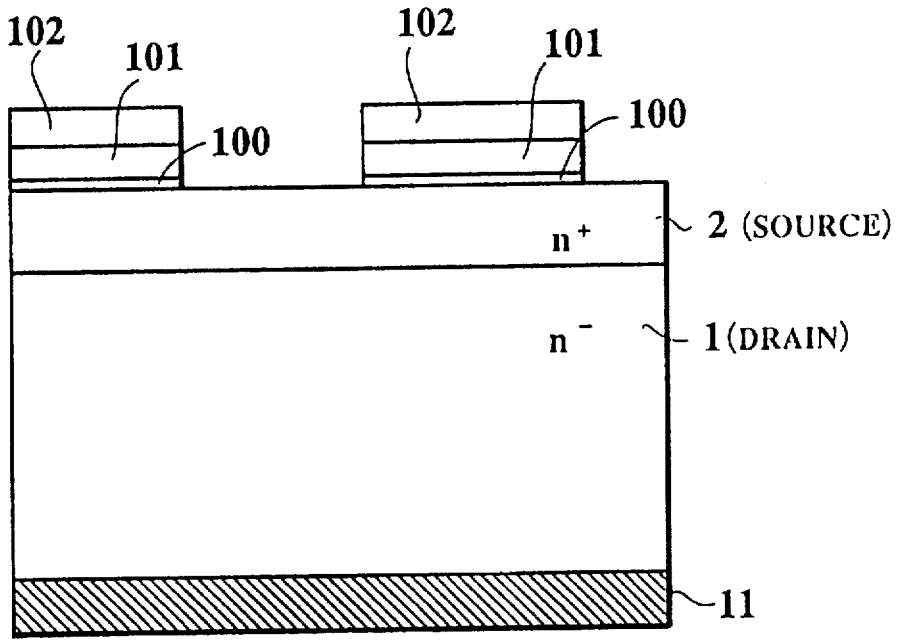
FIGS. 6(A) to 6(H) are cross-sectional view showing the manufacturing process of a vertical MOS semiconductor device, for assistance in explaining a second aspect of the method of manufacturing semiconductor devices according to the present invention.
Figure 6:
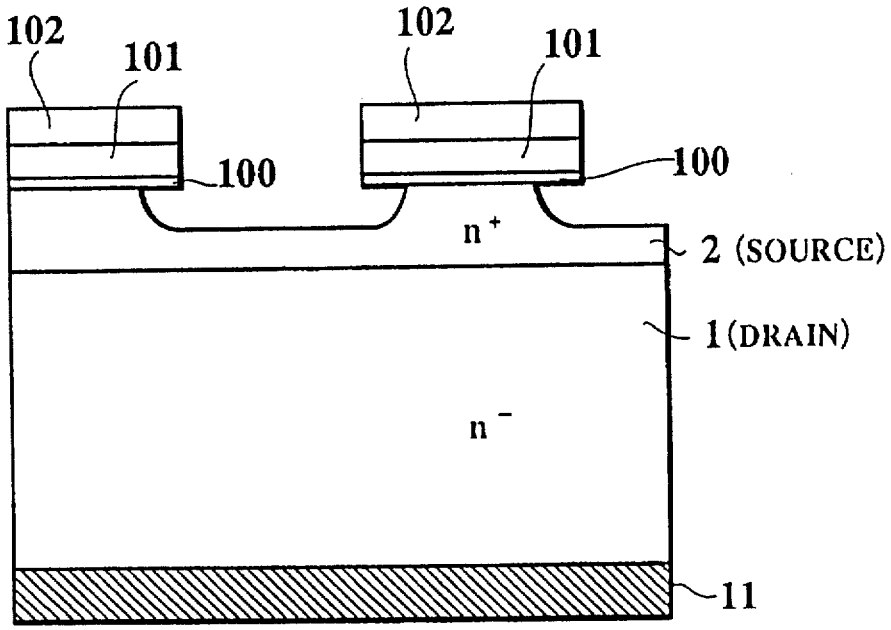
Figure 6:
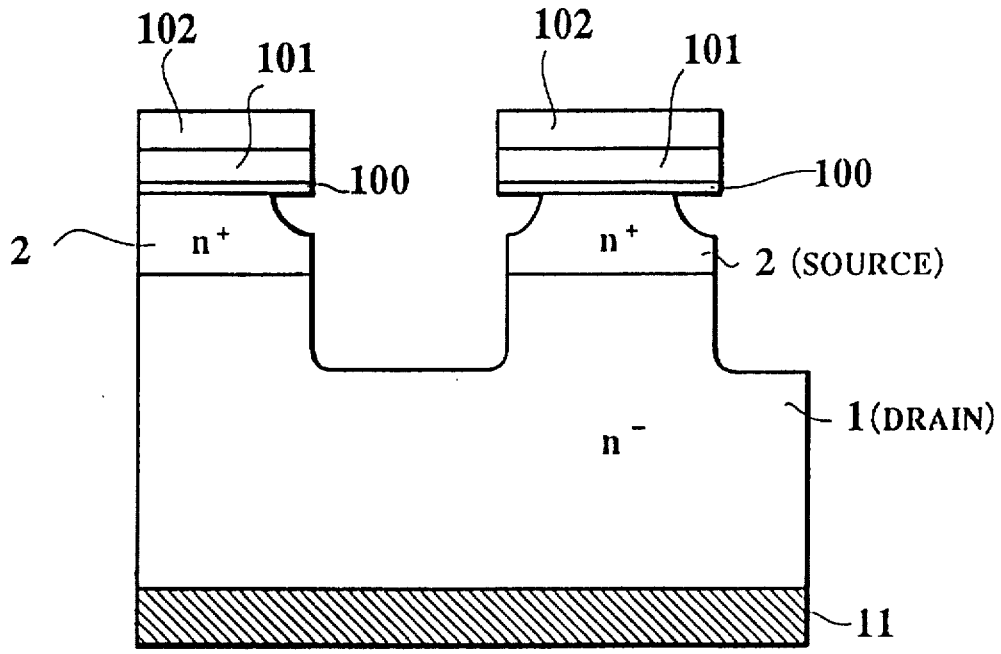
Figure 6:
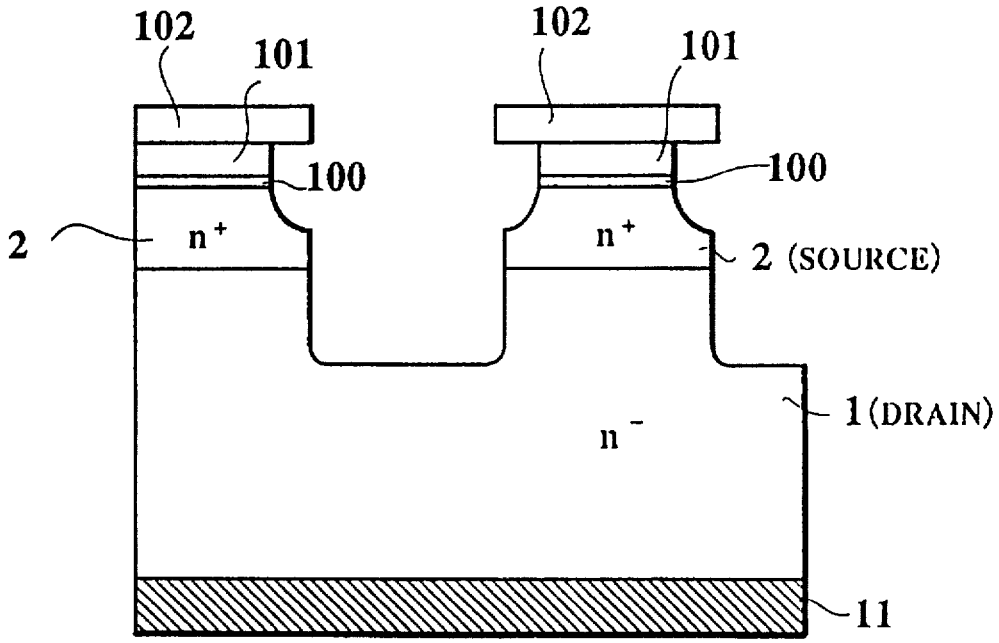
Figure 6:
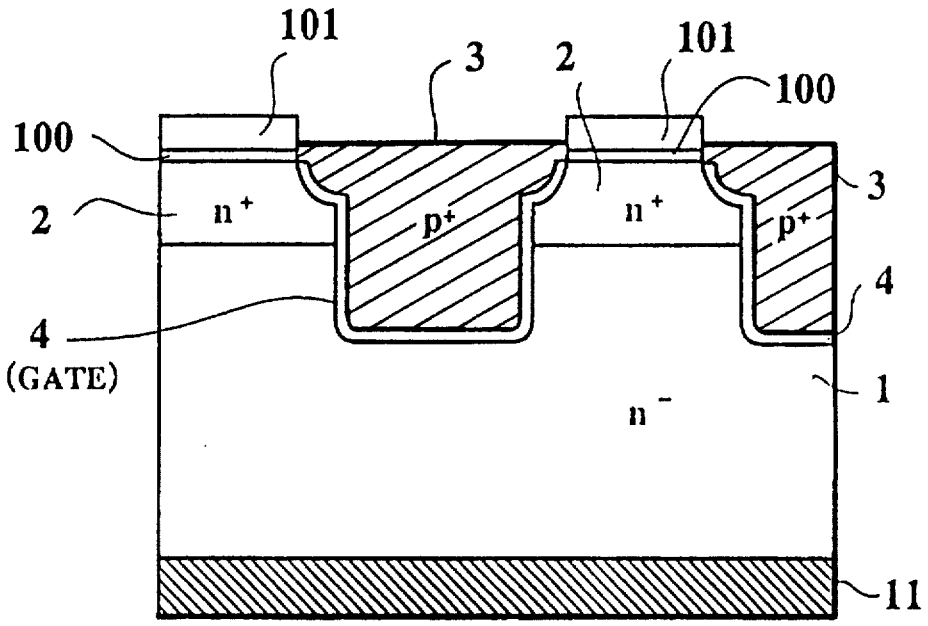
Figure 6:
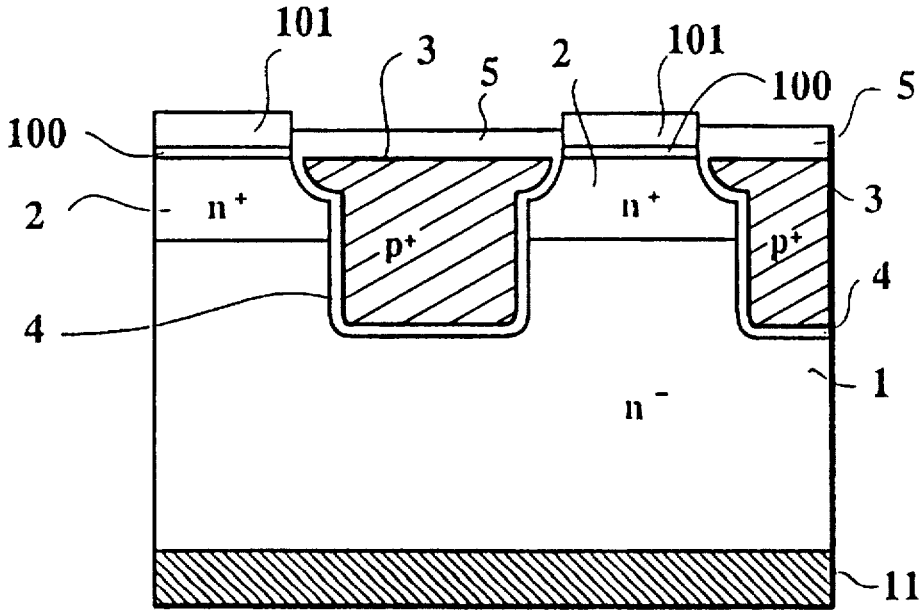
Figure 6:
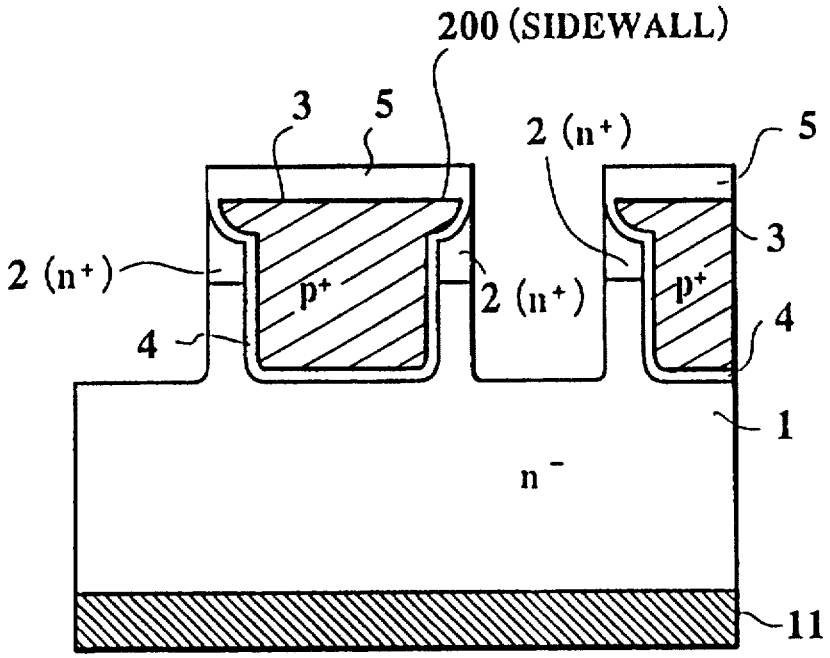
Figure 6:
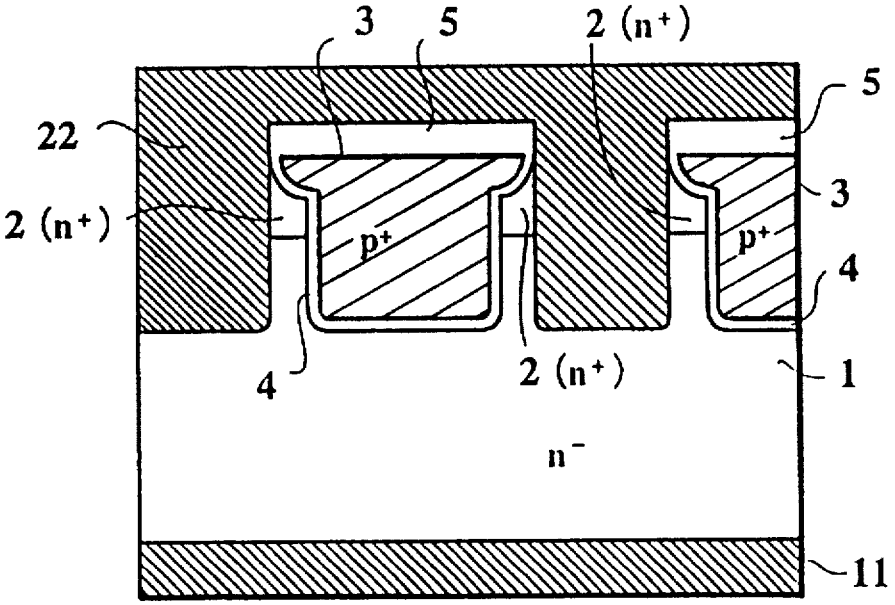

As shown in FIG. 6(A), an $n^+$ high impurity concentration source region 2 is formed on the surface of the $n^-$ semiconductor substrate of the drain region 1 in epitaxial growth technique or impurity atom diffusion technique. On the surface of this substrate, a thin oxide film 100, a silicon nitride film 101 for LOCOS, and an oxide film 102 for etching protection are formed in order, and these three-layer films are removed by anisotropic etching at only positions where gate electrodes are formed. Subsequently, as shown in FIG. 6(B), the $n^+$ source region 2 is removed a little by [aisotropic] *isotropic* etching to form side-etched portions under the masking films. The degree of this side etching determines the thickness H of the channel in the later process. The degree of this side etching is controllable down to 0.2 to 2 μm without dispersion.

Next, as shown in FIG. 6(C), part of the $n^-$ drain region 1 is removed deep by [isotropic] *anisotropic* etching using the masking films as a mask to form grooves for gate electrodes. Next, the inner surface of the groove formed by etching is removed by 20 nm by oxidization. At this time, the exposed portion of the oxide film 100 can be removed. Thereafter, a silicon nitride film 101 under the mask is removed by wet etching into a shape as shown in FIG. 6(D). Next, as shown in FIG. 6(E), a gate oxide film (insulated gate) 4 is formed on the surface of the gate grooves; a $p^+$-doped polysilicon conductive material 3 is buried in each groove to make the surface flat. Next, as shown in FIG. 6(F), the surface of the exposed polysilicon is oxidized by LOCOS oxidization method to form an interlayer insulating film 5 on the surface of the gate material so that T-shaped insulated gates is accomplished. Next, as shown in FIG. 6(G), the remaining masking films (silicon nitride film 101 and the thin oxide film 100) on the source retion 2 are removed by anisotropic etching. Further, the substrate 1 is deeply removed by [isotropic] *anisotropic* etching by using the T-shaped insulated gates 3 as mask to form almost vertical grooves. In this etching process, since the T-shaped insulated gate (sidewall) 200 has already been formed on the side surface of each gate electrode 3 when the $n^+$ region 2 is removed by [anisotropic] *isotropic* etching to form each side etched portion under the oxide film 100 as explained with reference to FIG. 6(B), when the substrate 1 is etched to form the control gate electrode (the same as the source electrode) 22, the thin region under the T-shaped insulated gate 200 becomes each channel range.

Lastly, as shown in FIG. 6(H), a metal Schottky junctioned with the $n^-$ drain region substrate 1 buried in the grooves formed by etching. This metal ohmicall connected to the $n^+$ source region 2 becomes a source electrode 22. The semiconductor device as shown in FIG. 7 can be manufactured in accordance with the above-mentioned process from (A) to (H).

As described above, according to the present invention, the vertical control gates are formed as follows: part of a semiconductor substrate 1 is removed by etching by use of masking material to form side-etched portions (FIG. 6B); a T-shaped insulated gate is formed by anisotropic etching with the same mask (FIG. 6C); a semiconductor region is left on the side surface of the insulated gate and under the T-shaped insulated gate (sidewall) 200 by etching the substrate with this insulated gate as mask (FIG. 6G); a metal Schottky junctioned to the substrate is buried in the groove formed by etching the substrate, to form a channel range in the semiconductor region on the sidewall of the insulated gate (FIG. 6H).

The channel thickness H is determined by the degree of side etched portion due to isotropic etching when the insulated gate is formed. The etching amount is about 0.2 to 2 μm without dispersion.

In the prior-art method, the photprocess is adopted to form the source electrode 22. Therefore, the size of the structure unit of the device (half structure unit is shown in FIG. 7) inevitably increases up to 7 μm or more under consideration of the overlap with the gate pattern, on the assumption that the minimum formable pattern size of the photodevice is 3 82 m. In the manufacturing method according to the present invention, however, since the source electrode or the control gate electrode 22 can be formed by a self-alignment method, it is possible to reduce the device structure unit as small as 3 μm. The above device structure can be applied to low voltage resistant devices with a high impurity atom concentration substrate.

As described above, in the present invention, since the Schottky junctioned electrodes so far formed by photoprocess are formed by utilizing the T-shaped insulated gates in self-alignment method, it is possible to reduce the channel thickness on the order of one figure at manufacturing precision. Therefore, there exist various advantages such that the device structure unit can be reduced; the device current capacity can be increased; and the method is applicable to low-voltage resistant elements of a high impurity atom concentration substrate.

What is claimed is:

1. A method of manufacturing a semiconductor device, comprising the steps of:

(a) forming at least one U-shaped insulated gate on a surface of a first conductivity type semiconductor substrate;

(b) exposing part of a sidewall of said U-shaped insulated gate by etching said substrate;

(c) covering the exposed part with a masking material;

(d) forming the sidewall of said masking material only adjoining to a side of said exposed part of said U-shaped insulated gate;

(e) forming at least one groove by etching said substrate almost vertically using said masking material sidewall as a mask; and (f) forming a second conductivity type semiconductor region on a surface of said groove and burying metal into said groove.

2. A method of manufacturing a semiconductor device, comprising the steps of:

(a) forming at least one U-shaped insulated gate on a surface of a first conductivity type semiconductor substrate;

(b) exposing part of a sidewall of said U-shaped insulated gate by etching said substrate;

(c) covering the exposed part with a masking material;

(d) forming the sidewall of said masking material only adjoining to a side of said exposed part of said U-shaped insulated gate;

(e) forming at least one groove by etching said substrate almost vertically using said masking material sidewall as a mask; and (f) burying metal into said groove and forming a Schottky junction with said substrate.

3. A method of manufacturing a semiconductor device, comprising the steps of:

(a) forming at least one U-shaped insulated gate on a surface of a first conductivity type semiconductor substrate;

(b) exposing part of a sidewall of said U-shaped insulated gate by etching said substrate;

(c) covering the exposed part with a masking material;

(d) forming the sidewall of said masking material only adjoining to a side of said exposed part of said U-shaped insulated gate;

(e) forming at least one groove by etching said substrate almost vertically using said masking material sidewall as a mask; and (f) forming another insulated gate on a surface of said groove and burying metal into said groove.

4. The method of claim 1, wherein said masking material is an insulator containing first conductivity type impurity atoms at high concentration, and which further comprises the step of forming a source region under the sidewall by annealing to diffuse impurity atoms from said masking material to said substrate region adjoining to said masking material after the sidewall has been formed.

5. The method of claim 1, wherein said masking material is a polycrystalline semiconductor containing first conductivity type impurity atoms at high concentration, and which further comprises the step of forming a source region under the sidewall by annealing to diffuse impurity atoms from said masking material to said substrate region adjoining to said masking material after the sidewall has been formed.

6. The method of claim 1, wherein said masking material is an amorphous semiconductor containing first conductivity type impurity atoms at high concentration, and which further comprises the step of forming a source region under the sidewall by annealing to diffuse impurity atoms from said masking material to said substrate region adjoining to said masking material after the sidewall has been formed.

7. A method of manufacturing a semiconductor device, which has a first conductivity type source region on a surface of a first conductivity type semiconductor substrate and has a *semiconductor* region put between an insulated gate and a metal forming *a* Schottky junction with said substrate and having the same electrical potential as said source region, *said semiconductor region being a part of said semiconductor substrate,* comprising the steps of:

(a) forming a first conductivity type and high impurity concentration source region on the surface of the first conductivity type semiconductor substrate;

(b) forming masking films on said source region;

(c) removing part of said films for a gate electrode;

(d) shallowly removing a part of the source region by [anisotropic] *isotropic* etching to form a side-etched portion under said masking films;

(e) deeply removing said substrate by [isotropic] *anisotropic* etching using said masking films as a mask to form a groove for a gate electrode;

(f) forming a gate oxide film on a surface of said gate groove;

(g) burying a conductive material into said groove as the gate electrode;

(h) forming an interlayer insulating film on a surface of said gate material to form a T-shaped cross-sectional insulated gate electrode;

(i) removing the remaining masking films on a surface of said source region;

(j) deeply removing said substrate by [isotropic] *anisotropic* etching by using said T-shaped insulated gate as a mask to form almost a vertical groove; and (k) burying metal into said groove as a source electrode.

* * * * *